US010043866B2

(12) United States Patent
Konrath et al.

(10) Patent No.: US 10,043,866 B2
(45) Date of Patent: Aug. 7, 2018

(54) SEMICONDUCTOR DEVICE AND A METHOD FOR FORMING A SEMICONDUCTOR DEVICE

(71) Applicant: Infineon Technologies AG, Neubiberg (DE)

(72) Inventors: Jens Peter Konrath, Villach (AT); Hans-Joachim Schulze, Taufkirchen (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/414,872

(22) Filed: Jan. 25, 2017

(65) Prior Publication Data

US 2017/0221987 A1    Aug. 3, 2017

(30) Foreign Application Priority Data

Jan. 29, 2016  (DE) .................. 10 2016 101 670

(51) Int. Cl.
| | |
|---|---|
| *H01L 29/76* | (2006.01) |
| *H01L 29/06* | (2006.01) |
| *H01L 29/78* | (2006.01) |
| *H01L 21/265* | (2006.01) |
| *H01L 29/66* | (2006.01) |

(52) U.S. Cl.
CPC ........ *H01L 29/0619* (2013.01); *H01L 21/265* (2013.01); *H01L 29/66666* (2013.01); *H01L 29/7827* (2013.01)

(58) Field of Classification Search
CPC ........... H01L 29/66666; H01L 29/7827; H01L 29/0619; H01L 21/265

USPC ........................................................ 257/367
See application file for complete search history.

(56) References Cited

U.S. PATENT DOCUMENTS

| | | | | |
|---|---|---|---|---|
| 5,006,476 A | * | 4/1991 | De Jong ........... | H01L 21/28525 148/DIG. 124 |
| 5,350,703 A | * | 9/1994 | Lee ....................... | H01L 27/112 257/E21.672 |
| 5,750,435 A | * | 5/1998 | Pan ................... | H01L 21/26586 257/E21.194 |
| 5,899,732 A | * | 5/1999 | Gardner ............. | H01L 21/2253 257/E21.147 |
| 7,989,321 B2 | | 8/2011 | Chen et al. | |
| 2013/0001580 A1 | | 1/2013 | Son et al. | |

(Continued)

FOREIGN PATENT DOCUMENTS

DE          2316096 A1    10/1974

OTHER PUBLICATIONS

Dobkin, Daniel M., "Gettering and Transport of Mobile Ion Contamination", Gettering and Mobile Ions, Jan. 2, 2016, pp. 1-7.

*Primary Examiner* — Luan C Thai
(74) *Attorney, Agent, or Firm* — Murphy, Bilak & Homiller, PLLC

(57) ABSTRACT

A method for forming a semiconductor device includes forming an oxide layer on a semiconductor substrate. A first portion of the oxide layer forms a gate oxide of a transistor structure. The method further includes replacing or modifying a second portion of the oxide layer to obtain a contamination barrier layer structure comprising phosphorus. The contamination barrier layer structure is located at a distance of less than 10 μm from the first portion of the oxide layer.

23 Claims, 5 Drawing Sheets

(56) References Cited

U.S. PATENT DOCUMENTS

2013/0307127 A1    11/2013   Schulze et al.
2015/0064882 A1     3/2015   Danno et al.

* cited by examiner

SEMICONDUCTOR DEVICE AND A METHOD FOR FORMING A SEMICONDUCTOR DEVICE

TECHNICAL FIELD

Embodiments relate to a semiconductor device and a method for forming a semiconductor device.

BACKGROUND

Contamination of the gate oxide of power metal oxide semiconductor field effect transistors (MOSFETs) and insulated gate bipolar transistors (IGBTs) may result in a shift of the threshold voltage (V_TH) in the MOSFETs and IGBTs. This may cause problems when connecting several MOSFET cells or IGBT cells in parallel, as those switching on first (having a lower V_TH) have to carry a large part of the load current until the remaining ones (having a larger V_TH) switch on as well. The same may also apply to the switch-off process. If, in addition, the threshold voltage shifts to the point that it is outside the operating range of the drive, the MOSFET or IGBT can no longer be switched on and/or off, and/or may switch too soon.

SUMMARY

It is a demand to provide concepts for semiconductor devices with improved reliability and/or an improve robustness against contamination.

Some embodiments relate to a method for forming a semiconductor device. The method comprises forming an oxide layer on a semiconductor substrate. A first portion of the oxide layer forms a gate oxide of a transistor structure. The method further comprises replacing or modifying a second portion of the oxide layer to obtain a contamination barrier layer structure comprising phosphorus. The contamination barrier layer structure is located at a distance of less than 10 µm from the first portion of the oxide layer.

Some embodiments relate to a semiconductor device. The semiconductor device comprises a contamination barrier layer structure located directly at a surface of a semiconductor substrate. The contamination barrier layer structure is located at a distance of less than 10 µm from a gate oxide of a transistor structure. The contamination barrier layer structure comprises a phosphorus content of greater than 1%.

Those skilled in the art will recognize additional features and advantages upon reading the following detailed description and on viewing the accompanying drawings.

BRIEF DESCRIPTION OF THE FIGURES

Some embodiments of apparatuses and/or methods will be described in the following by way of example only, and with reference to the accompanying figures, in which.

DETAILED DESCRIPTION

Various example embodiments will now be described more fully with reference to the accompanying drawings in which some example embodiments are illustrated. In the figures, the thicknesses of lines, layers and/or regions may be exaggerated for clarity.

Accordingly, while example embodiments are capable of various modifications and alternative forms, embodiments thereof are shown by way of example in the figures and will herein be described in detail. It should be understood, however, that there is no intent to limit example embodiments to the particular forms disclosed, but on the contrary, example embodiments are to cover all modifications, equivalents, and alternatives falling within the scope of the disclosure. Like numbers refer to like or similar elements throughout the description of the figures.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art. However, should the present disclosure give a specific meaning to a term deviating from a meaning commonly understood by one of ordinary skill, this meaning is to be taken into account in the specific context this definition is given herein.

Figure 1:
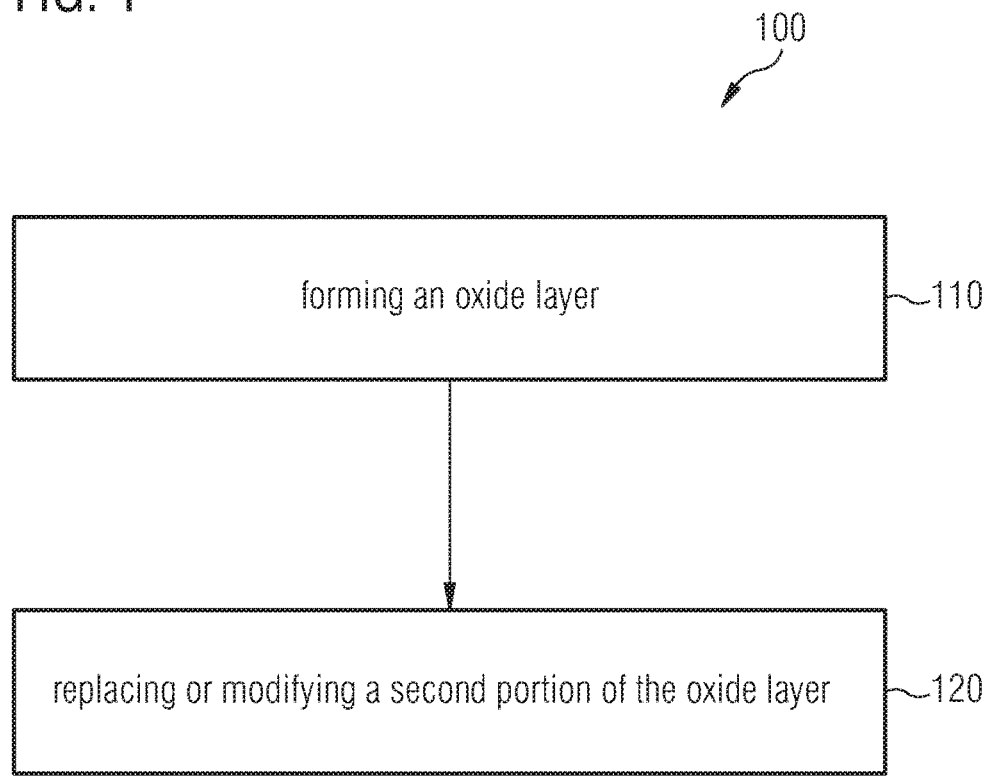
FIG. 1 shows a schematic illustration of a flow chart of a method for forming a semiconductor device.

FIG. 1 shows a schematic illustration of a flow chart of a method 100 for forming a semiconductor device according to an embodiment.

The method 100 comprises forming 110 an oxide layer on a semiconductor substrate. A first portion of the oxide layer forms a gate oxide of a transistor structure. The method 100 further comprises replacing or modifying 120 a second portion of the oxide layer to obtain a contamination barrier layer structure comprising phosphorus. The contamination barrier layer structure is located at a distance of less than 10 µm from the first portion of the oxide layer.

Due to the replacing or modifying of a second portion of the oxide layer to obtain a contamination barrier layer structure comprising phosphorus, the contamination barrier layer structure may provide a gettering structure and/or improve a gettering efficiency of contaminants. For example, a higher level of robustness of the gate oxide against alkali metals and/or alkaline earth metals may be provided by the contamination barrier layer structure being at a distance of less than 10 µm from the first portion of the oxide layer (e.g. the gate oxide). The contamination barrier layer structure may provide a shielding effect for the gate oxide and may furthermore interrupt an ion path to the gate oxide, or an ion path through the oxide layer between neighboring gates.

The oxide layer may be formed at or on a first lateral surface of the semiconductor substrate. The oxide layer may be formed by oxidizing the semiconductor substrate (e.g. a silicon substrate) at the first lateral surface of the semiconductor substrate to form the oxide layer. Alternatively or optionally, the oxide layer may be formed by depositing the oxide layer on the first lateral surface of the semiconductor substrate (e.g. by chemical vapor deposition, or e.g. plasma enhanced chemical vapor deposition PECVD, or e.g. low pressure chemical vapor deposition LPCVD).

The first portion of the oxide layer forms a gate oxide (GOX) of a transistor structure. For example, the first portion of the oxide layer (and thus, the gate oxide of the transistor structure) may be located adjacent (e.g. directly adjacent) to at least a body region of the transistor structure located in the semiconductor substrate. Additionally, the first portion of the oxide layer may be located adjacent to (or e.g. overlap) at least part of a source region of the transistor structure and at least part of a drain region of the transistor structure for the case of a lateral transistor structure.

In the case of the transistor structure being a vertical transistor structure and having a lateral gate, a gate electrode of the transistor structure may be located on (e.g. directly adjacent to) the first portion of the oxide layer at the first lateral surface of the semiconductor substrate. For example, the first portion of the oxide layer (and thus, the gate oxide of the transistor structure) may be formed or located at the first lateral surface of the semiconductor substrate between at least the body region of the transistor structure and the gate electrode, for example.

In the case of the transistor structure being a vertical transistor structure and having a trench gate, a gate trench structure extending substantially vertically into the semiconductor substrate from the first lateral surface of the semiconductor substrate may be formed. Optionally, the method 100 may include forming the gate trench structure before forming the oxide layer on the semiconductor substrate. After forming the gate trench structure (e.g. by etching), the oxide layer may be formed at the first lateral surface of the semiconductor substrate. Additionally, the oxide layer may be formed at (or on) at least one sidewall (or e.g. one or more sidewalls) of the gate trench structure and/or at (or on) a bottom of the gate trench structure.

Alternatively or optionally, the method 100 may include forming the oxide layer at the first lateral surface of the semiconductor substrate before forming the gate trench structure. At least part of the oxide layer may be etched at the location at which the gate trench structure is to be formed followed by the forming of the gate trench structure. After forming the gate trench structure, the first portion of the oxide layer may be formed at (or on) at least one sidewall (or e.g. one or more sidewalls) of the gate trench structure and/or at (or on) a bottom of the gate trench structure. The first portion of the oxide layer formed after forming the gate trench structure and portions of the oxide layer formed before forming the gate trench structure may be part of (or form) a continuous oxide layer on the semiconductor substrate, for example.

The oxide layer may include or may be a dielectric material and/or an electrically insulating material. The oxide layer may include silicon dioxide, for example. Optionally, the oxide layer may be a high dielectric constant (high-K) dielectric material. The oxide layer may have an average thickness of between 1 nm and 200 nm (e.g. between 2 nm and 100 nm, or e.g. between 5 nm and 50 nm), for example.

The method 100 further comprises replacing or modifying 120 the second portion (different from the first portion) of the oxide layer to obtain the contamination barrier layer structure comprising phosphorus. The second portion of the oxide layer may be selectively replaced or modified. For example, the method 100 may further include forming a mask layer (e.g. a photoresist layer) on the semiconductor substrate. The second portion of the oxide layer may be replaced or modified at regions of the semiconductor substrate uncovered (e.g. not covered) by the mask layer. Any portions of the oxide layer covered by the mask layer may be protected from replacement or modification carried out at the second portion of the oxide layer. For example, at least part of (e.g. one or more portions) of the oxide layer may remain on the semiconductor substrate after replacing or modifying the second portion of the oxide layer. For example, at least part the oxide layer may remain on at least part of the source region of the transistor structure and/or on at least part of a shielding doping region of the transistor structure after replacing or modifying the second portion of the oxide layer. The mask layer may be formed to avoid short circuits between the source region and other doping regions which may be caused by the replaced or modified second portion of the oxide layer, and/or to avoid any influence of their modification on the threshold voltage of the device.

The second portion of the oxide layer (to be modified or replaced) may be located at a distance (e.g. a lateral distance) of less than 10 μm (or e.g. less than 5 μm, or e.g. less than 3 μm, or e.g. less than 1 μm, or e.g. less than 500 nm, or e.g. less than 50 nm) from the first portion of the oxide layer. For example, a distance between the second portion of the oxide layer and the first portion of the oxide layer may be less than 10 μm. Optionally, the second portion of the oxide layer may be located adjacent (e.g. directly adjacent) to the first portion of the oxide layer. For example, the second portion of the oxide layer may be located at at least one end (e.g. a distal end, or e.g. a lateral end) of the first portion of the oxide layer.

In the case of the transistor structure having a lateral gate, the first portion of the oxide layer may be located on the first lateral surface of the semiconductor substrate. Additionally, the second portion of the oxide layer may be located at (e.g. a distance of less than 10 μm from, or e.g. directly laterally adjacent to) a first lateral end of the first portion of the oxide layer at the first lateral surface of the semiconductor substrate and at (e.g. directly laterally adjacent to) a second lateral end of the first portion of the oxide layer at the first lateral surface of the semiconductor substrate.

In the case of the transistor structure having a trench gate, the first portion of the oxide layer may be located at at least one sidewall of the gate trench structure and at a bottom of the gate trench structure. Additionally, the second portion of the oxide layer may be located at (e.g. a distance of less than 10 μm from, or e.g. directly adjacent to, or e.g. directly on) a first lateral end of the first portion of the oxide layer at the first lateral surface of the semiconductor substrate and at (e.g. a distance of less than 10 μm from, or e.g. directly adjacent to, or e.g. directly on) a second lateral end of the first portion of the oxide layer at the first lateral surface of the semiconductor substrate. For example, the first lateral end of the first portion of the oxide layer may be located at the first sidewall of the gate trench structure and the second lateral end of the first portion of the oxide layer may be located at the second opposite sidewall of the gate trench structure.

The second portion of the oxide layer to be modified or replaced may be located on (e.g. directly adjacent to) at least part of a source region of the transistor structure. Additionally or optionally, the second portion of the oxide layer to be modified or replaced may be located on (e.g. directly adjacent to) at least part of shielding doping region of the transistor structure. Optionally, the shielding doping region may be a doping region of a diode structure (e.g. on an anode doping region of a freewheeling diode structure).

The second portion of the oxide layer may be modified by incorporating phosphorus dopants into the second portion of the oxide layer to obtain the contamination barrier layer structure. For example, the phosphorus dopants may be incorporated (e.g. deposited, or e.g. implanted) into the second portion of the oxide layer by plasma deposition (PLAD) or ion implantation. For example, the phosphorus dopants may be incorporated into the second portion of the oxide layer using a dose of between $1*10^{16}$ dopants per $cm^2$ and $5*10^{17}$ dopants per $cm^2$ (or e.g. between $2*10^{16}$ dopants per $cm^2$ and $4*10^{17}$ dopants per $cm^2$, or e.g. between $5*10^{16}$ dopants per $cm^2$ and $1*10^{17}$ dopants per $cm^2$). The modified second portion of the oxide layer may be similar to a phosphosilicate glass (PSG). After the phosphorus implantation or plasma deposition, a high temperature annealing process may be optionally performed to obtain a broader distribution of the phosphorus atoms along the oxide thickness. For example, the vertical extension of the phosphorus atoms may correspond to between 10% and 90% (or e.g. between 20% and 85%, or e.g. between 30% and 80%) of the oxide thickness.

By the local high-dose phosphorus implantation (PLAD) into the LPCVD-GOX (gate oxide) in the upper trench area, the GOX may be enriched by gettering atoms e.g. particularly phosphorus, and thus locally to a PSG-similar layer. The implantation may be structured (e.g. by the mask layer), to avoid a negative influence on the threshold voltage of the semiconductor device to be formed, and/or to avoid p-top to source shorts (or short circuits between the source region and to a shielding doping region and/or to other doping regions). The PSG-similar layers may cause contaminations (e.g., alkali ions) to be gettered by the PSG-similar layer and thus to be unable to penetrate up to the gate oxide by diffusion in the oxide.

Optionally or alternatively, the second portion of the oxide layer may be replaced. Replacing the second portion of the oxide layer may include removing the second portion of the oxide layer and replacing the second portion of the oxide layer with the contamination barrier layer structure comprising phosphorus. For example, the GOX may be removed locally outside the trench, with the PSG deposition taking place immediately afterwards. For example, the second portion of the oxide layer may be removed and the contamination barrier layer structure may be deposited immediately after removing the second portion of the oxide layer. No in-situ process is available, for example.

The contamination barrier layer structure may include one or more (e.g. at least one, or e.g. a plurality of) contamination barrier layers. At least one contamination barrier layer of the contamination barrier layer structure may comprise phosphorus. For example, at least one contamination barrier layer of the contamination barrier layer structure may be a phosphosilicate glass (PSG) layer. The use of PSG may enable a good gettering efficiency. The phosphorus proportion may be between 2% to 4%. For concentrations over 5%, adverse reactions may result with regard to the furnace atmosphere, for example.

Optionally, the contamination barrier layer structure may include at least two different contamination barrier layers selected from the group of layers comprising (or consisting of) a phosphosilicate glass layer (PSG), a borophosphosilicate glass layer (BPSG) and a silicate glass (SG) layer. For example, if required, the layer stack (e.g. the contamination barrier layer structure) may include at least two of the following materials: PSG, undoped SG and BPSG. For example, the contamination barrier layer structure may include a SG-PSG layer stack, or a SG-PSG-SG layer stack, or a SG-PSG-BPSG-SG layer stack, or a SG-BPSG-PSG-SG layer stack, for example. Optionally, the contamination barrier layer structure may include at least one PSG layer.

Optionally or alternatively, the second portion of the oxide layer may be modified by forming at least one contamination barrier layer of the contamination barrier layer structure directly on the second portion of the oxide layer. For example, optionally, a PSG layer may be deposited directly on the gate oxide (e.g. on the second portion of the oxide layer). This may provide an improved gettering capability due to the adjacent PSG. However it does not involve a direct interruption of the ion path.

The obtained contamination barrier layer structure (after replacing or modifying the second portion of the oxide layer) may be located at a distance (e.g. a lateral distance) of less than 10 μm (or e.g. less than 5 μm, or e.g. less than 3 μm, or e.g. less than 1 μm, or e.g. less than 500 nm, or e.g. less than 50 nm) from the first portion of the oxide layer. Optionally, the contamination barrier layer structure may be located adjacent to the first portion of the oxide layer. For example, the obtained contamination barrier layer structure may be located at a distance of less than 10 μm from (or e.g. less than 5 μm, or e.g. less than 3 μm, or e.g. less than 1 μm, or e.g. less than 500 nm, or e.g. less than 50 nm, or e.g. directly laterally adjacent to) a first lateral end of the first portion of the oxide layer at the first lateral surface of the semiconductor substrate and at a distance of less than 10 μm from (or e.g. less than 5 μm, or e.g. less than 3 μm, or e.g. less than 1 μm, or e.g. less than 500 nm, or e.g. less than 50 nm, or e.g. directly laterally adjacent to) a second lateral end of the first portion of the oxide layer at the first lateral surface of the semiconductor substrate.

Additionally or optionally, the contamination barrier layer structure may extend (laterally) along the surface of the semiconductor substrate from at least part of the gate oxide (e.g. starting at a lateral distance of less than 10 μm or e.g. less than 5 μm, or e.g. less than 3 μm, or e.g. less than 1 μm, or e.g. less than 500 nm, or e.g. less than 50 nm, or directly at a lateral end of the gate oxide). For example, at least part of the contamination barrier layer structure may be located between a gate electrode and a source contact area. The source contact area may be an area where a source electrode is formed directly adjacent to a source region in the semiconductor substrate, for example. At least part of the contamination barrier layer structure may be located at a distance of less than 10 μm from (or e.& less than 5 μm, or e.g. less than 3 μm, or e.g. less than 1 μm, or e.g. less than 500 nm, or e.g. less than 50 nm, or e.g. directly laterally adjacent to, or e.g. directly on) at least part of a source region of the transistor structure.

Additionally or optionally, at least part of the contamination barrier layer structure may be located between at least a lateral end of the gate oxide and one or more inter-metal layers. For example, a first portion of the contamination barrier layer structure may be located between a first lateral end of the first portion of the oxide layer (e.g. the gate oxide) and one or more inter-metal layers. Additionally or optionally, a second portion of the contamination barrier layer structure may be located between a second lateral end of the first portion of the oxide layer (e.g. the gate oxide) and one or more inter-metal layers.

The obtained contamination barrier layer structure may have (or include) a phosphorus content of greater than 1% (or e.g. greater than 2%, or e.g. between 2% and 5%, or e.g. between 2% and 4%) of the total content of the contamination harrier layer structure, for example. Optionally, each contamination barrier layer of the contamination barrier layer structure may have a phosphorus content of greater than 1% (or e.g. greater than 2%, or e.g. between 2% and 5%).

Optionally, the method 100 may further include incorporating further gettering dopants into the second portion of the oxide layer after incorporating the phosphorus dopants. The further gettering dopants may include dopants different from phosphorus dopants (e.g. boron dopants).

Optionally, if more phosphorus dopants are incorporated than boron dopants if a majority of the incorporated gettering dopants are phosphorus dopants), the contamination barrier layer structure may have a negative overall charge and may be used to attract positively charged contaminants (e.g. sodium ions and/or potassium ions). Optionally, if more boron dopants are incorporated than phosphorus dopants (e.g. if a majority of the incorporated gettering dopants are boron dopants), the contamination barrier layer structure may have positive negative overall charge and may be used to attract negatively charged contaminants.

The method 100 may further include forming the gate electrode of the trench gate transistor structure. The gate electrode of the trench gate transistor structure may be located (or formed) in (e.g. within, or e.g. at least partially within) the gate trench structure. The first portion of the oxide layer may be located adjacent to the source region and to the body region of the transistor structure at the at least one sidewall of the gate trench structure, for example. The first portion of the oxide layer forms the gate oxide of the transistor structure at at least one sidewall of the gate trench structure. For example, the first portion of the oxide layer may be located between at least the body region of the transistor structure and the gate electrode.

The gate electrode of the transistor structure may be formed before replacing or modifying the second portion of the oxide layer, for example. The gate electrode may be formed (e.g. deposited and structured) on the first portion of the oxide layer, for example. Due to the gate electrode of the transistor structure being formed before replacing or modifying the second portion of the oxide layer, the gate electrode may protect or mask the first portion of the oxide layer from replacement or modification during the replacement or modification of the second portion of the oxide layer. Alternatively or optionally, the gate electrode of the transistor structure may be formed after replacing or modifying the second portion of the oxide layer. For example, a temporary mask layer may be formed on the first portion of the oxide layer, which protects or masks the first portion of the oxide layer from replacement or modification during the replacement or modification of the second portion of the oxide layer. After replacing or modifying the second portion of the oxide layer, the temporary mask layer may be removed and the gate electrode may be formed (e.g. deposited and structured) on the first portion of the oxide layer.

The method 100 may further include forming one or more inter-metal layers after replacing or modifying the second portion of the oxide layer to obtain the contamination barrier layer structure. At least part of an inter-metal layer may be formed above (or e.g. directly on) the contamination barrier layer structure, for example. Additionally, the one or more inter-metal layers may be formed above the gate electrode, the contamination barrier layer structure, the source region and/or a gate pad structure, for example. The one or more inter-metal layers may be inter-metal dielectric (MD) layers. For example, the one or more inter-metal layers may be electrically insulating layers. Optionally, the one or more inter-metal layers may include BPSG, SG or PSG material. For example, the one or more inter-metal layers may be BPSG, SG and/or PSG layers.

The method 100 may further include forming one or more electrode layers (e.g. a source electrode layer, or e.g. a drain electrode layer) after replacing or modifying the second portion of the oxide layer to obtain the contamination barrier layer structure. The one or more electrode layers may be formed above the gate electrode and the contamination barrier layer structure, for example. Optionally, the one or more electrode layers may be formed on at least one inter-metal layer, for example.

The method 100 achieves a higher level of robustness of the gate oxide (GOX) against alkali metals and alkaline earth metals by locally interrupting oxides which are in contact with the gate oxide, by the implementation of oxides capable of gettering (PSG, BPSG). Following the manufacture of the GOX (e.g. the gate oxide layer) and, if needed, the poly gate (electrode) and its structuring, the GOX is enriched by gettering atoms, in particular phosphorus doping, in the area adjacent to the gate trench using PLAT) or also using ion implantation. Optionally, other atoms (e.g., boron) may additionally be implanted as well. Long implantation times may be necessary due to the high dose required. The targeted. P-implantation dose may be in the range between $1.0*10^{16}$ per $cm^2$ and $5.0*10^{17}$ per $cm^2$. Optionally, following the introduction of the gettering atoms, an annealing step may also be performed entailing a vertical broadening of the implantation profile. In this respect, the purpose of the structured implantation is to avoid p-top to source shorts (e.g., in a SiC TMOSFET) or gate to source shorts, or any negative influence of the implanted atoms on the threshold voltage, for example.

Alternatively, the oxide between the trenches and/or the cells may be interrupted by a masked etching to prevent the contamination from spreading. Immediately after this structuring, a PSG and/or one of the above layer stacks is deposited on the interruption of the oxide created in this way.

The method 100 may further avoid or reduce complex manufacturing processes, such as by subdividing the semiconductor manufacturing in FOOL (front end of line) and BEOL (back end of line), with recurring contamination analyses in both areas having the purpose to identify problems at an early stage. Additionally or optionally, the method 100 may avoid or reduce identifying the source of the contamination and, hence, finding remedial measures, which may be time-consuming and expensive. Additionally or optionally, the method 100 may avoid, or reduce electrical tests with regard to time variability of V_TH having to be carried out, which increase the test duration per device and therefore the cost of testing.

The method 100 may be used for forming a SiC Trench MOSFET semiconductor devices or semiconductor devices based on other materials such as Si. Optionally, the method 100 may be used for forming IGBTs and compensation MOSFETs, for example. For example, the transistor structure may be a metal oxide semiconductor field effect transistor (MOSFET) structure, or an insulated gate bipolar transistor (IGBT) structure, for example. For example, the examples may relate to SiC semiconductor circuits (e.g. SiC MOS transistors, SiC compensation transistors, SiC MOSFETs, SiC compensation MOSFETs).

Each MOSFET structure or IGBT structure may include a source or emitter region having a first conductivity type (e.g. n+ doped), a body region having a second conductivity type (e.g. p-type doped) and a drift region (e.g. n-type doped) located adjacent to a transistor gate or transistor gate trench structure.

In the case of the transistor structure being a MOSFET structure, the drift region of the MOSFET structure may be located between a body region of the MOSFET structure and a drain region of the MOSFET structure located at a second lateral side (e.g. a back surface) of the semiconductor substrate. The drain region of the MOSFET structure may have the first conductivity type (e.g. n+ doped), for example.

In the case of the transistor structure being an IGBT structure, the drift region of the IGBT structure may be located between a body region of the IGBT structure and a collector region of the IGBT structure located at the second lateral side (e.g. a back surface) of the semiconductor substrate. The collector region of the IGBT structure may have the second conductivity type (e.g. p+ doped). Optionally, a field stop region having the first conductivity type (e.g. n+ doped) and higher doped than the drift region may be located between the drift region and the collector region of the IGBT structure.

The semiconductor substrate may be a silicon-based semiconductor substrate. Optionally, the semiconductor substrate may be a Czochralski grown semiconductor (silicon) substrate or a float zone semiconductor (silicon) substrate. Optionally or alternatively, the semiconductor substrate may be wide band gap semiconductor substrate having a band gap larger than the band gap of silicon (1.1 eV). For example, semiconductor substrate may be a silicon carbide (SiC)-based semiconductor substrate, or gallium arsenide (GaAs)-based semiconductor substrate, or a gallium nitride (GaN)-based semiconductor substrate.

A first lateral surface or front surface of the semiconductor substrate may be a surface of the semiconductor substrate towards metal layers, insulation layers and/or passivation layers on top of the surface of the substrate or a surface of one of these layers. For example, a semiconductor substrate front side may be the side at which active elements of the chip are formed. For example, in a power semiconductor chip, a chip front side may be a side of the chip at which a source region and a gate region are formed, and a chip back side may be a side of the chip at which a drain region is formed. For example, more complex structures may be located at the chip front side than at the chip back side. For example, in a source-down configuration a source region and gate region may be located at the back side of the chip and the drain region may be located at the front side of the chip.

A lateral surface of the semiconductor substrate may be a substantially even plane (e.g. neglecting unevenness of the semiconductor structure due to the manufacturing process and trenches). For example, the lateral dimension of the lateral surface of the semiconductor substrate may be more than 100 times larger (or more than 1000 times or more than 10000 times) than a maximal height of structures on the main surface. In comparison to a basically vertical edge (e.g. resulting from separating the substrate of the chip from others) of the semiconductor substrate, the lateral surface may be a basically horizontal surface extending laterally. The lateral dimension of the lateral surface of the semiconductor substrate may be more than 100 times larger (or more than 1000 times or more than 10000 times) than a basically vertical edge of the semiconductor substrate, for example.

A vertical direction may be a direction orthogonal (or perpendicular) to the lateral surface of the semiconductor substrate, for example.

A region comprising the first conductivity type may be a p-type doped region (e.g. caused by incorporating aluminum ions or boron ions) or an n-type doped region (e.g. caused by incorporating nitrogen ions, phosphor ions or arsenic ions). Consequently, the second conductivity type indicates an opposite n-type doped region or p-type doped region. In other words, the first conductivity type may indicate an n-type doping and the second conductivity type may indicate a p-type doping or vice-versa.

Figure 2A:
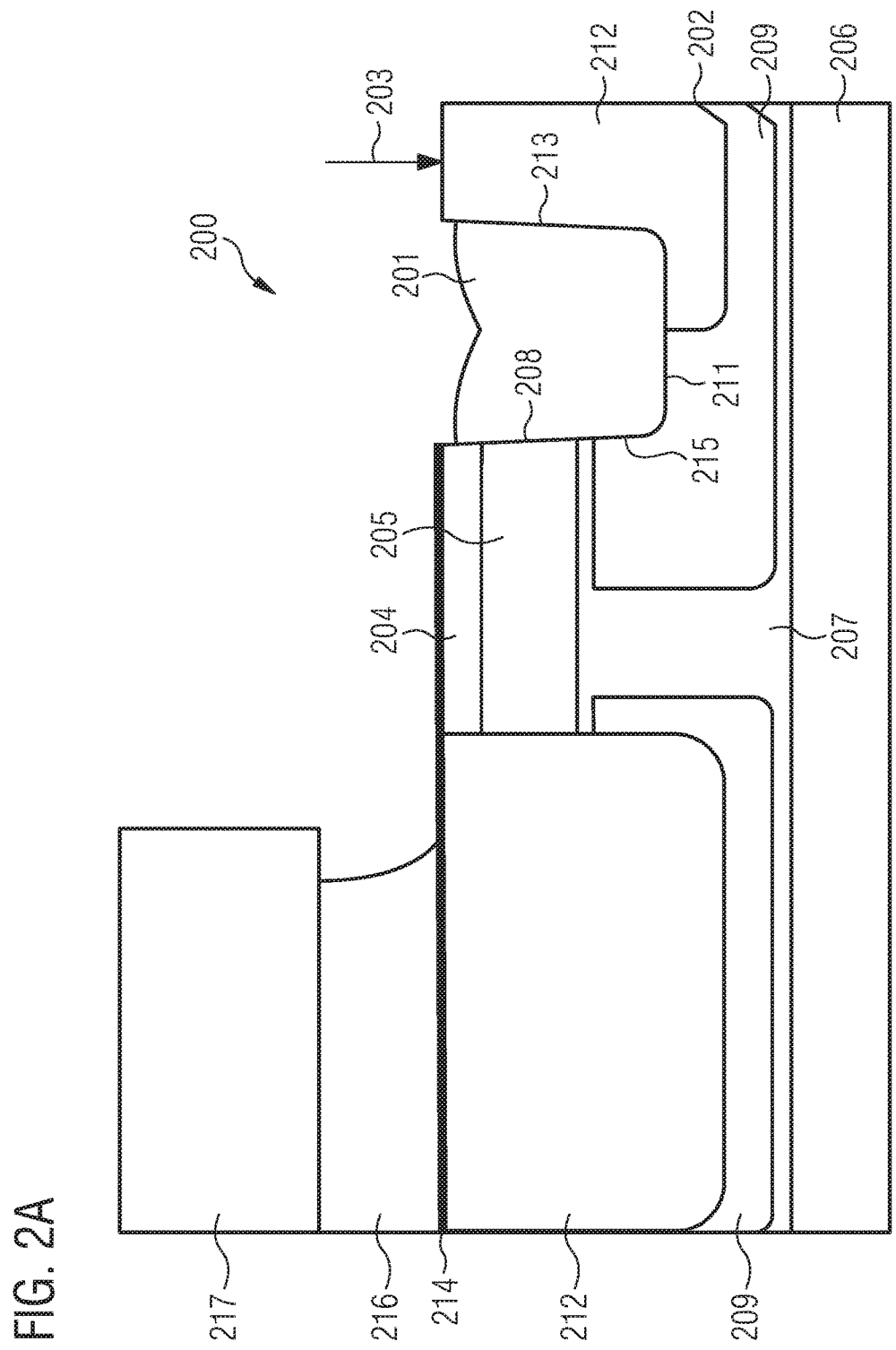
FIGS. 2A to 2C show schematic illustrations of a method for forming a semiconductor device.
Figure 2B:
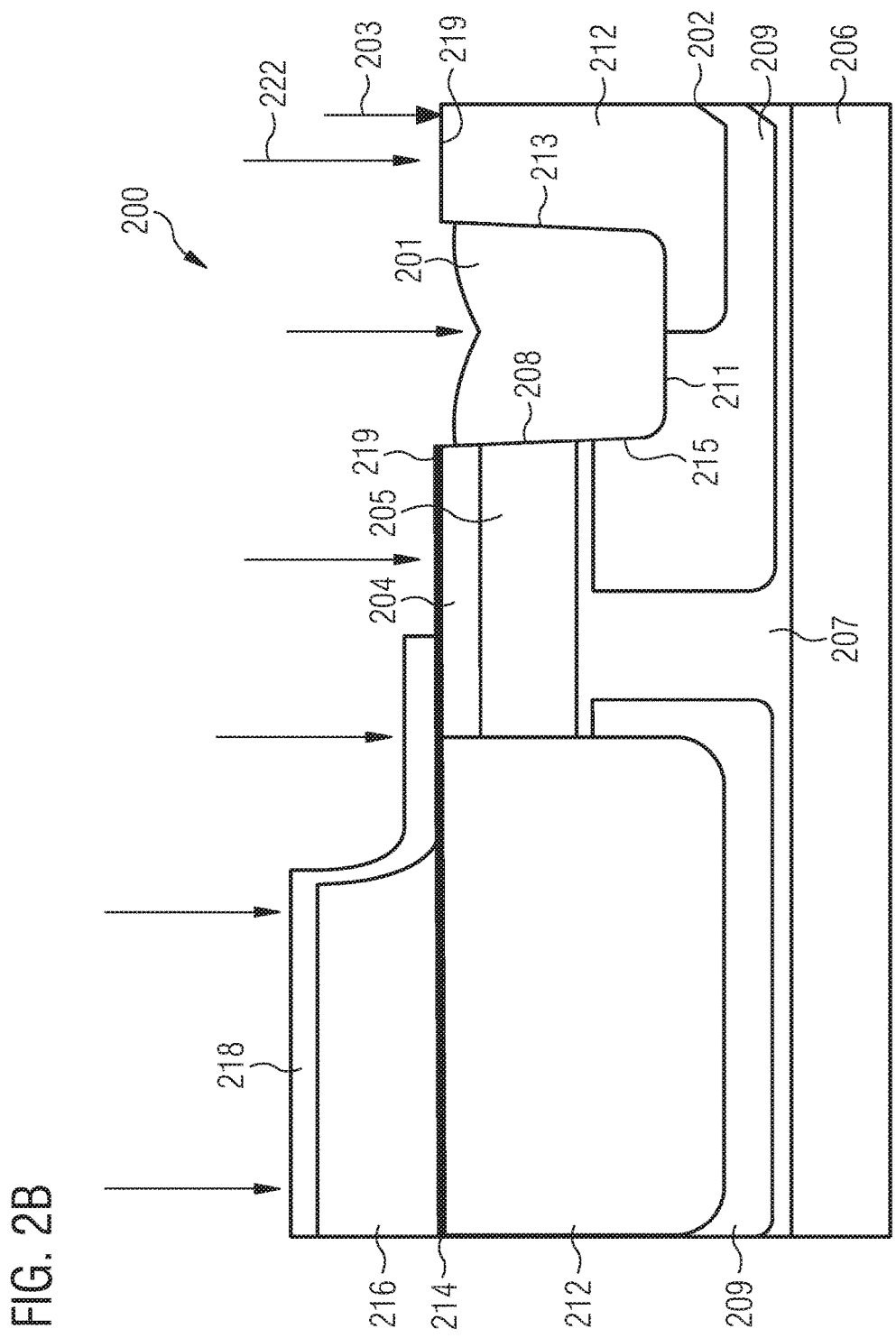
Figure 2C:
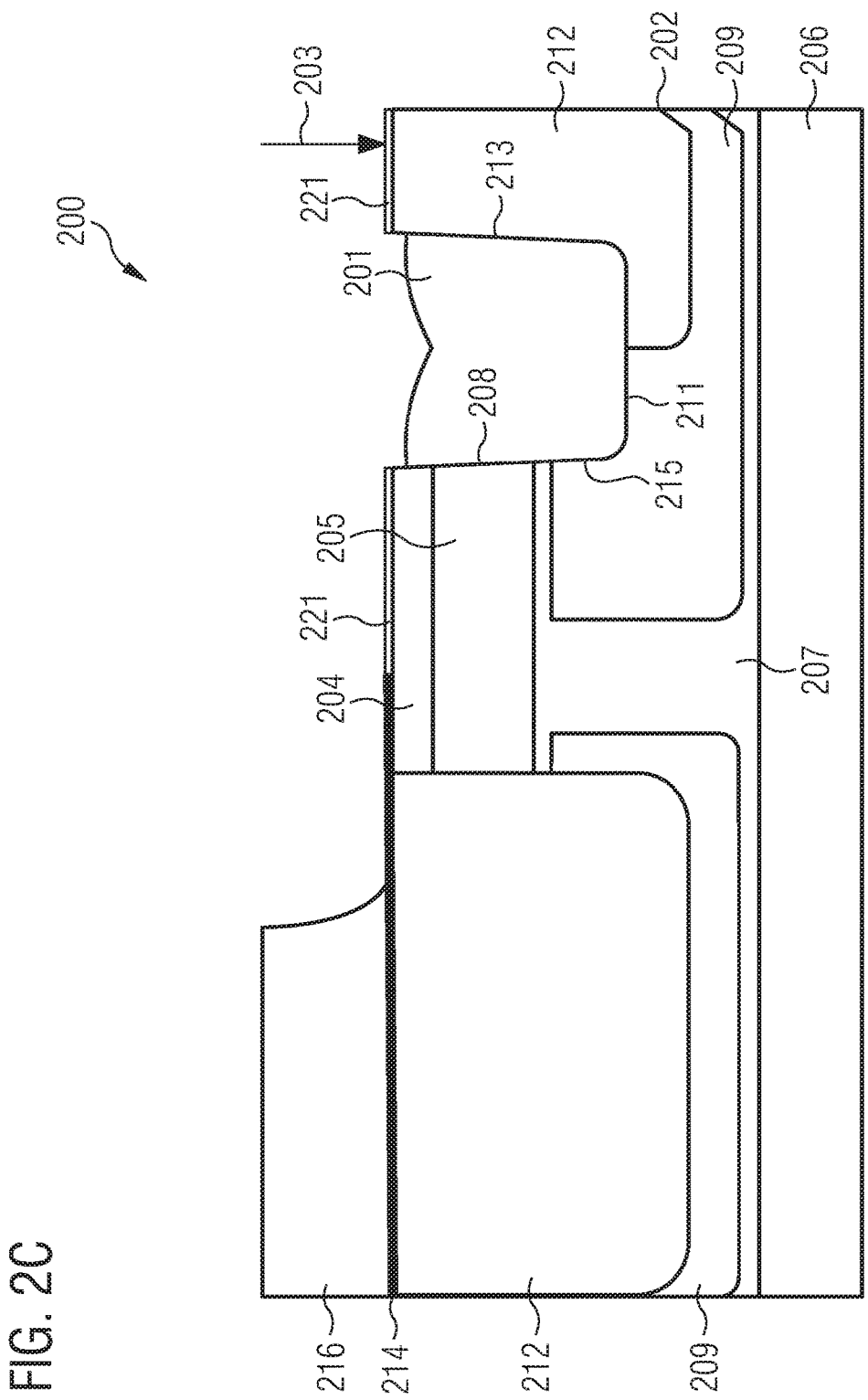

FIGS. 2A to 2C show schematic illustrations of a method for forming a semiconductor device 200 according to an embodiment. The semiconductor device 200 to be formed may be a trench gate MOSFET transistor structure, (e.g. a SIC trench MOSFET or TMOSFET), for example.

FIG. 2A shows a schematic illustration of a semiconductor device 200 to be formed after structuring of a gate electrode 201 and/or a gate pad structure 216 of the semiconductor device 200. For example, FIG. 2A shows a semiconductor device 200 having a TMOSFET structure having gate pad and a trench.

Optionally, the semiconductor device 200 to be formed may include the gate electrode 201 of the trench gate transistor structure located in (e.g. within, or e.g. at least partially within) a gate trench structure. The gate trench structure may extend substantially vertically into the semiconductor substrate 202 from the first (front) lateral surface 203 of the semiconductor substrate 202.

Optionally, the semiconductor device 200 to be formed may include a source region 204 of the transistor structure located in the semiconductor substrate 202. The source region 204 may be located directly at the first lateral surface 203 of the semiconductor substrate. At least part of the source region 204 of the transistor structure may be located at the first sidewall 208 of the gate trench structure.

The source region 204 may have a doping of the first conductivity type (e.g. an type doping), for example. The source region 204 may have an average doping concentration of at least $1\times10^{17}$ dopants per cm$^3$ (or e.g. between $1\times10^{17}$ dopants per cm$^3$ and $1\times10^{20}$ dopants per cm$^3$, or e.g. between $1\times10^{17}$ dopants per cm$^3$ and $1\times10^{19}$ dopants per cm$^3$), for example. The average doping concentration may be a measured number of dopants per volume averaged over the source region 204, for example.

Optionally, the semiconductor device 200 to be formed may further include a body region 205 of the transistor structure located in the semiconductor substrate 202. The body region 205 of the transistor structure may be located directly adjacent to (e.g. directly below) the source region 204 of the transistor structure. For example, the body region 205 of the transistor structure may be located deeper in the semiconductor substrate 202 than the source region 204 of the transistor structure. At least part of the body region 205 of the transistor structure may be located at the first sidewall 208 of the gate trench structure.

The body region 205 may have a doping of the second conductivity type (e.g. a p type doping), for example. The body region 205 may have an average doping concentration of between $5\times10^{16}$ dopant atoms per $cm^3$ and $1\times10^{19}$ dopant atoms per $cm^3$ (or e.g. between $2\times10^{17}$ dopant atoms per $cm^3$ and $1\times10^{13}$ dopant atoms per $cm^3$), for example. The average doping concentration may be a measured number of dopants per volume averaged over the body region 205, for example.

Optionally, the semiconductor device 200 to be formed may further include a shielding doping region located in the semiconductor substrate 202. The shielding doping region may be located adjacent to the gate trench structure. The shielding doping region May have a doping of the second conductivity type (e.g. a p type doping), for example.

A first portion 209 of the shielding doping region may be located adjacent to at least part of the first sidewall 208 of the gate trench structure and at least part of a bottom 211 of the gate trench structure, for example. The first portion 209 of the shielding doping region may be located below the body region 205 of the transistor structure at the first sidewall 208 of the gate trench structure.

The first portion 209 of the shielding doping region may have a doping of the second conductivity type (e.g. a p type doping), for example. The first portion 209 of the shielding doping region may have an average doping concentration of greater than $1\times10^{16}$ dopant atoms per $cm^3$ (or e.g. greater than $1\times10^{17}$ dopant atoms per $cm^3$, or e.g. greater than $1\times10^{18}$ dopant atoms per $cm^3$). The average doping concentration may be a measured number of dopants per volume averaged over the first portion 209 of the shielding doping region, for example.

The first portion 209 of the shielding doping region may be implemented in a silicon carbide IGBT semiconductor device 200, for example. However, for a silicon IGBT semiconductor device 200 (which may have a lower breakdown field strength and/or a lower blocking voltage than a silicon carbide IGBT semiconductor device 200), the first portion 209 of the shielding doping region may be omitted, for example.

A second portion 212 of the shielding doping region (e.g. a p+ top portion) may be located adjacent to at least part of the second sidewall 213 of the gate trench structure and at least part of the bottom 211 of the gate trench structure, for example. At least part of the second portion 212 of the shielding doping region may be located adjacent to the first portion 209 of the shielding doping region. For example, at least part of the first portion 209 of the shielding doping region may be formed around a bottom and/or a side of the second portion 212 of the shielding doping region. Optionally, the second portion 212 of the shielding doping region may be (or form at least part of) a doping region of a diode structure (e.g. a free-wheeling diode structure) of the semiconductor device.

The second portion 212 of the shielding doping region may have a doping of the second conductivity type (e.g. a p type doping), for example. The second portion 212 of the shielding doping region may have an average doping concentration greater than an average doping concentration of the first portion 209 of the shielding doping region. For example, the second portion 212 of the shielding doping region may have an average doping concentration of greater than $1\times10^{17}$ dopant atoms per $cm^3$ (or e.g. greater than $1\times10^{18}$ dopant atoms per $cm^3$, or e.g. greater than $1\times10^{19}$ dopant atoms per $cm^3$). The average doping concentration may be a measured number of dopants per volume averaged over the second portion 212 of the shielding doping region, for example.

Optionally, the semiconductor device 200 to be formed may further include a drift region of the transistor structure located in the semiconductor substrate 202. The drift region may have a doping of the first conductivity type (e.g. an n type doping), for example.

The drift region of the transistor structure may include an intermediate drift portion (n2) 207 having the doping of the first conductivity type. At least part of the intermediate drift portion 207 of the drift region may be located adjacent to (e.g. directly adjacent to, or e.g. below) the body region 205 of the transistor structure. At least part of the intermediate drift portion 207 of the drift region may be located laterally adjacent to the first portion 209 of the shielding doping region, for example. At least part of the intermediate drift portion 207 of the drift region may be located laterally between neighboring first portions 209 of the shielding doping region. Additionally or optionally, at least part of the intermediate drift portion 207 of the drift region may be located adjacent to a bottom of (e.g. below) the first portion 209 of the shielding doping region. Additionally or optionally, at least part of the intermediate drift portion 207 of the drift region may be located vertically adjacent to the body region 205 of the transistor structure at the first sidewall 208 of the gate trench structure. For example, the body region 205 may be located between at least part of the intermediate drift portion 207 of the drift region and the source region 204 at the first sidewall 208 of the gate trench structure. Additionally or optionally, at least part of the intermediate drift portion 207 of the drift region may be located vertically between the body region 205 of the transistor structure and the first portion 209 of the shielding doping region.

The intermediate drift portion 207 of the drift region may have an average doping concentration of at least $1\times10^{17}$ dopants per $cm^3$ (or e.g. between $1\times10^{17}$ dopants per $cm^3$ and $1\times10^{19}$ dopants per $cm^3$, or e.g. between $1\times10^{17}$ dopants per $cm^3$ and $1\times10^{18}$ dopants per $cm^3$), for example. The average doping concentration may be a measured number of dopants per volume averaged over the intermediate drift portion 207 of the drift region, for example.

The drift region of the transistor structure may include a drift zone portion 206 having the doping of the first conductivity type. At least part of the intermediate drift portion 207 of the drift region may be located between the drift zone portion 206 of the drift region and the body region 205 of the transistor structure. Additionally or optionally, at least part of the intermediate drift portion 207 of the drift region may be located between the drift zone portion 206 of the drift region and the first portion 209 of the shielding doping region. The drift zone portion 206 of the drift region of the transistor structure may be located between a drain region of the transistor structure and the intermediate drift portion 207 of the drift region.

The drift zone portion 206 of the drift region may have an average doping concentration lower than the intermediate drift portion 207 of the drift region. The drift zone portion 206 of the drift region may have an average doping concentration of at least $1\times10^{17}$ dopants per $cm^3$ (or e.g. between $1\times10^{17}$ dopants per $cm^3$ and $1\times10^{19}$ dopants per $cm^3$, or e.g. between $1\times10^{17}$ dopants per $cm^3$ and $1\times10^{18}$ dopants per $cm^3$), for example. The average doping concentration may be a measured number of dopants per volume averaged over the drift zone portion 206 of the drift region, for example.

Optionally, the semiconductor device 200 to be formed may further include the drain region of the transistor structure located at a second (back) lateral surface of the semiconductor substrate. The drain region may have a doping of the first conductivity type (e.g. an n+ type doping), for example. The drain region may have an average doping concentration of at least $1\times10^{17}$ dopants per cm$^3$ (or e.g. between $1\times10^{17}$ dopants per cm$^3$ and $1\times10^{19}$ dopants per cm$^3$, or e.g. between $1\times10^{17}$ dopants per cm$^3$ and $1\times10^{18}$ dopants per cm$^3$), for example. The average doping concentration may be a measured number of dopants per volume averaged over the drain region, for example.

The method may include forming the doping regions of the transistor structure (e.g. the source region 204, the body region 205 and the drift region 206, 207) before forming the oxide layer 214 on the semiconductor substrate 202. Additionally or optionally, the method may include forming other doping regions of the semiconductor device (e.g. the first portion 209 of the shielding doping region and/or the second portion 212 of the shielding doping region) before forming the oxide layer 214 on the semiconductor substrate 202.

The method includes forming the oxide layer 214 on the semiconductor substrate 202. For example, the oxide layer 214 may be formed on the first lateral surface 203 of the semiconductor substrate 202. At least part of the oxide layer may be formed on the source region 204 of the transistor structure and on the second portion 212 of the shielding doping region at the first lateral surface 203 of the semiconductor substrate 202. The first portion 215 of the oxide layer 214 may be formed at (or on) the sidewalls 208, 213 and at (or on) a bottom of the gate trench structure. The first portion 215 of the oxide layer 214 forms a gate oxide of a transistor structure, for example.

The method may further include forming a gate (polysilicon) layer on the oxide layer 214 and forming a gate mask layer 217 (e.g. a photoresist layer) after forming the gate layer. The gate mask layer formed may allow for selective structuring (e.g., polysilicon structuring, or e.g. removing) of the gate layer to form the gate electrode 201 and/or the gate paid structure 216, for example.

After the structuring of the gate layer, the gate pad structure 216 and/or the gate electrode 201 may be obtained (or may remain) on at least part of the oxide layer 214. The semiconductor device 200 to be formed may thus include the gate pad structure 216 formed on at least part of the oxide layer 214. For example, the gate pad structure 216 may be formed on at least part of the oxide layer 214 located adjacent to e.g. directly on) a portion (e.g. the second portion 212) of the shielding doping region.

FIG. 2B shows a schematic illustration of the semiconductor device 200 to be formed after structuring the gate layer (e.g. after forming the gate electrode 201 and the gate pad structure 216). For example, FIG. 2B shows a resist mask 218 for plasma deposition (PLAD). The resist mask 218 covers parts of the p-top and the n-source, for example.

After (or following) the poly structuring of the gate layer, the gate mask layer 217 may be removed. Additionally, or optionally, a further mask layer 218 (e.g. a resist mask) may be formed which covers parts of the p+ top portion 212 and part of the source region 204. For example, the method may include forming the mask layer 218 on at least part of the source region 204 of the transistor structure and on the gate pad structure 216. Thus, the mask layer 218 may cover at least part of a shielding doping region of a transistor structure (e.g. a second portion 212 of a shielding doping region of a neighboring transistor structure).

Additionally or optionally, the mask layer 218 may cover the gate pad structure 216 and at least a second portion of the source region 204 of the transistor structure. The second portion of the source region 204 may be located further from the first portion 215 of the oxide layer than a first portion of the source region 204, for example.

Additionally, the first portion of the source region 204 directly adjacent to the first side wall 208 (and/or directly adjacent to the first portion 215 of the oxide layer at the first sidewall 208) may be uncovered (e.g. not covered) by the mask layer 218. Additionally, at least part of the shielding doping region (e.g., at least part of the second portion 212 of the shielding doping region) directly adjacent to the second sidewall 213 (and/or directly adjacent to the first portion 215 of the oxide layer at the second sidewall 213) may be uncovered (e.g. not covered) by the mask layer 218. Thus, the second portion 219 of the oxide layer 214 located on the first portion of the source region 204 directly adjacent to the first sidewall 208 (or directly adjacent to the first portion 215 of the oxide layer at the first sidewall 208) may be uncovered (e.g. not covered) by the mask layer 218. Additionally, the second portion 219 of the oxide layer 214 located on at least part of the shielding doping region (e.g. at least part of the second portion 212 of the shielding doping region) directly adjacent to the second sidewall 213 (or directly adjacent to the first portion 215 of the oxide layer at the second sidewall 213) may be uncovered (e.g. not covered) by the mask layer 218.

The second portion 219 of the oxide layer 214 may be replaced or modified at regions of the semiconductor substrate 202 uncovered (e.g. not covered or unmasked) by the mask layer 218. Any portions of the oxide layer covered (or masked) by the mask layer may be protected from replacement or modification carried out at the second portion 219 of the oxide layer.

Optionally, the second portion 219 of the oxide layer 214 may be modified by incorporating 222 phosphorus dopants into the second portion 219 of the oxide layer 214 by plasma deposition (PLAD) or ion implantation to obtain the contamination barrier layer structure 221. Forming the resist mask layer 218 may be followed by the plasma doping (or ion implantation) with phosphorus after forming the resist mask layer 218. After the removal of the resist mask coating, the resulting structure may be further processed.

Optionally or alternatively, the second portion 219 of the oxide layer 214 may be replaced by removing the second portion 219 of the oxide layer 214 and replacing the second portion 219 of the oxide layer 214 with the contamination barrier layer structure 221 comprising phosphorus. For example, the second portion 219 of the oxide layer 214 may be removed by a dry chemicals process via the resist mask. Following the removal of the resist mask, the PSG (the contamination barrier layer structure 221) may be deposited.

Optionally or alternatively, the second portion 219 of the oxide layer 214 may be modified by forming at least one contamination barrier layer of the contamination barrier layer structure 221 directly on the second portion 219 of the oxide layer 214.

Optionally or alternatively, instead of removing the gate mask layer 217 and forming the further mask layer 218 before modifying or replacing the second portion 219 of the oxide layer 214, it may be possible to omit the forming of the further mask layer 218. Thus, the gate mask layer 217 may be used for the selective modifying or replacing the oxide layer 214 at the second portion 219 of the oxide layer 214.

FIG. 2C shows a schematic illustration of the semiconductor device 200 to be formed after replacing or modifying the second portion (219 as shown in FIG. 2B) of the oxide layer 214 to obtain the contamination barrier layer structure 221 comprising phosphorus. The contamination barrier layer structure 221 may be obtained by replacing or modifying the second portion 219 of the oxide layer 214 according to one or more of the processes described in connection with FIG. 1 and FIGS. 2A to 2B. The resulting contamination barrier layers of the contamination barrier layer structure 221 (e.g. the PSG layer) may have a shielding effect with regard to the GOX in the trench and may furthermore interrupt the GOX (or oxide layer) between neighboring trenches.

The examples herein have described the forming of a contamination barrier layer structure 221 for protecting a gate oxide from contaminants. It may however be understood that the examples herein may additionally or alternatively be used for protecting other oxides of the semiconductor device. For example, similar measures may also be provided for in the edge region of the device in order to protect the oxides present in the edge region from contamination.

More details and aspects are mentioned in connection with the embodiments described above or below. The embodiments shown in each of FIGS. 2A to 2C may comprise one or more optional additional features corresponding to one or more aspects mentioned in connection with the proposed concept or one or more embodiments described above (e.g. FIG. 1) or below (e.g. FIG. 3).

Figure 3:
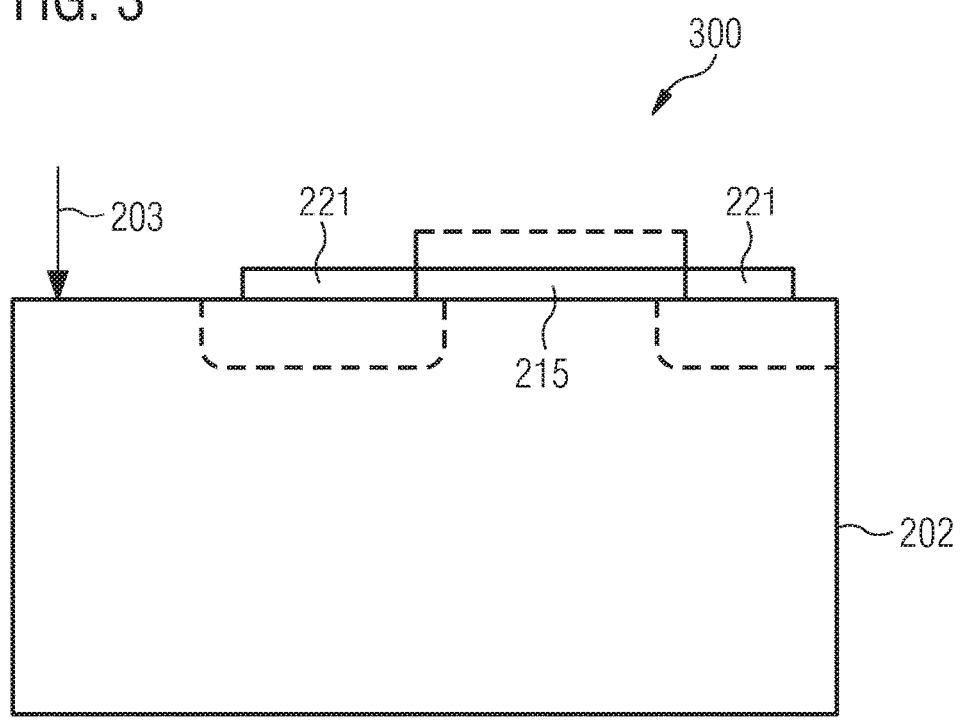
FIG. 3 shows a schematic illustration of a semiconductor device.

FIG. 3 shows a schematic illustration of a semiconductor device 300 according to an embodiment.

The semiconductor device 300 comprises a contamination barrier layer structure 221 located directly at a surface 203 of a semiconductor substrate 202. The contamination barrier layer structure 221 is located at a distance of less than 10 µm from a gate oxide 215 of a transistor structure. The contamination barrier layer structure comprises a phosphorus content of greater than 1%.

Due to the contamination barrier layer structure 221 being located directly at a surface 203 of a semiconductor substrate 202 and at a distance of less than 10 µm from a gate oxide 215 of a transistor structure, the contamination barrier layer structure may provide a gettering structure and/or improve a gettering efficiency of contaminants. For example, a higher level of robustness of the gate oxide 215 against alkali metals and/or alkaline earth metals may be provided by the contamination barrier layer structure 221. The contamination barrier layer structure 221 may provide a shielding effect for the gate oxide 215 and may furthermore interrupt an ion path to the gate oxide 215, or an ion path through an oxide layer between neighboring gates.

The semiconductor device 300 may include one or more or all of the features of the semiconductor device to be formed according to the method described in connection with FIGS. 1 to 2C.

The contamination barrier layer structure 221 is located directly at a surface 203 of a semiconductor substrate 202. For example, the contamination barrier layer structure 221 may be located directly adjacent to the surface 203 of the semiconductor substrate 202. For example, no intermediate layers are located between the contamination barrier layer structure 221 and the surface 203 of the semiconductor substrate.

The contamination barrier layer structure 221 is located at a distance of less than 10 µm (or e.g. less than 5 µm, or e.g. less than 3 µm, or e.g. less than 1 µm, or e.g. less than 500 nm, or e.g. less than 50 nm) from a gate oxide 215 of a transistor structure. Optionally, the contamination barrier layer structure may be located adjacent (e.g. directly adjacent) to the gate oxide 215 of the transistor structure. For example, the contamination barrier layer structure 221 may be located adjacent to a first lateral end of the gate oxide 215 and to a second lateral end of the gate oxide 215. For example, the gate electrode may be located on a surface of the gate oxide 215 located between portions of the contamination barrier layer structure 221. Additionally or optionally, the contamination barrier layer structure 221 may be located between at least a lateral end of the gate oxide 215 and one or more inter-metal (electrically insulating and/or dielectric) layers, which may be formed on or above the contamination barrier layer structure 221 and/or on the gate electrode.

Optionally, the contamination barrier layer structure 221 may extend along the surface 203 of the semiconductor substrate (e.g. in a lateral direction) from at least part of the gate oxide 215 (e.g. starting at a first lateral end of the gate oxide 215). The contamination barrier layer structure 221 may extend along the surface 203 of the semiconductor substrate from (or starting at) a first lateral end of the gate oxide 215 towards a gate pad structure, for example. At least part of the contamination barrier layer structure 221 may be located adjacent (g. at a distance of less than 10 µm, or e.g. directly adjacent) to a source region of the transistor structure, for example. Optionally or additionally, the contamination barrier layer structure 221 may be located between a gate electrode of the transistor structure and a source contact area. The source contact area may be an area where a source electrode is formed directly adjacent to the source region in the semiconductor substrate, for example.

The contamination barrier layer structure may have (or include) a phosphorus content of greater than 1% (or e.g. greater than 2%, or e.g. between 2% and 5%, or e.g. between 2% and 4%) of the contents of the contamination barrier layer structure, for example. Optionally, each contamination barrier layer of the contamination barrier layer structure may have a phosphorus content of greater than 1% (or e.g. greater than 2%, or e.g. between 2% and 5%).

At least one contamination barrier layer of the contamination barrier layer structure may comprise phosphorus. For example, at least one contamination barrier layer of the contamination barrier layer structure may be a phosphosilicate glass layer (PSG). Optionally, the contamination barrier layer structure may include at least two different contamination barrier layers selected from the group of layers comprising (or consisting of) a phosphosilicate glass layer (PSG), a borophosphosilicate glass layer (BPSG) and a silicate glass (SG) layer. For example, if required, the layer stack (e.g. the contamination barrier layer structure) may include at least two of the following materials: PSG, undoped SG and BPSG. For example, the contamination barrier layer structure may include a SG-PSG layer stack, or a SG-PSG-SG layer stack, or a SG-PSG-BPSG-SG layer stack, or a SG-BPSG-PSG-SG layer stack, for example.

The semiconductor device 300 may include a lateral gate of a vertical transistor structure or a trench gate of a vertical transistor structure, for example. In the case of the transistor structure having a lateral gate, the gate oxide may be located on the surface 203 of the semiconductor substrate. In the case of the transistor structure having a trench gate, the gate oxide 215 and at least pail of the gate electrode of the transistor structure may located in a trench (e.g. a gate trench structure) extending into the semiconductor substrate 202.

The transistor structure of the semiconductor device 300 may have a breakdown voltage or blocking voltage of more than 10V (e.g. a breakdown voltage of 10 V, 20 V or 50V), more than 100 V (e.g. a breakdown voltage of 200 V, 300 V, 400V or 500V) or more than 500 V (e.g. a breakdown voltage of 600 V, 700 V, 800V or 1000V) or more than 1000 V (e.g. a breakdown voltage of 1200 V, 1500 V, 1700V, 2000V, 3300V or 6500V), for example.

More details and aspects are mentioned in connection with the embodiments described above or below. The embodiments shown in FIG. 3 may comprise one or more optional additional features corresponding to one or more aspects mentioned in connection with the proposed concept or one or more embodiments described above (e.g. FIG. 1 to 2C) or below.

Various examples relate to a method for avoiding contamination of a gate oxide.

Aspects and features (e.g. the semiconductor device, the gate trench structure, the transistor structure, the semiconductor substrate, the shielding doping region, the first portion of the shielding doping region, the second portion of the shielding doping region, the first sidewall of the gate trench structure, the bottom of the gate trench structure, the second sidewall of the gate trench structure, the drift region, the body region, the contamination barrier layer structure, the oxide layer, the first portion of the oxide layer, the second portion of the oxide layer, the drift region, the intermediate portion of the drift region, the drift zone portion of the drift region, the source region, the drain region, the gate pad structure and the inter-metal layers) mentioned in connection with one or more specific examples may be combined with one or more of the other examples.

Example embodiments may further provide a computer program having a program code for performing one of the above methods, when the computer program is executed on a computer or processor. A person of skill in the art would readily recognize that acts of various above-described methods may be performed by programmed computers. Herein, some example embodiments are also intended to cover program storage devices, e.g., digital data storage media, which are machine or computer readable and encode machine-executable or computer-executable programs of instructions, wherein the instructions perform some or all of the acts of the above-described methods. The program storage devices may be, e.g., digital memories, magnetic storage media such as magnetic disks and magnetic tapes, hard drives, or optically readable digital data storage media. Further example embodiments are also intended to cover computers programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. It will thus be appreciated that those skilled in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and embodiments of the disclosure, as well as specific examples thereof, are intended to encompass equivalents thereof.

It should be appreciated by those skilled in the art that any block diagrams herein represent conceptual views of illustrative circuitry embodying the principles of the disclosure. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

Furthermore, the following claims are hereby incorporated into the Detailed Description, where each claim may stand on its own as a separate embodiment. While each claim may stand on its own as a separate embodiment, it is to be noted that—although a dependent claim may refer in the claims to a specific combination with one or more other claims—other embodiments may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective acts of these methods.

Further, it is to be understood that the disclosure of multiple acts or functions disclosed in the specification or claims may not be construed as to be within the specific order. Therefore, the disclosure of multiple acts or functions will not limit these to a particular order unless such acts or functions are not interchangeable for technical reasons. Furthermore, in some embodiments a single act may include or may be broken into multiple sub acts. Such sub acts may be included and part of the disclosure of this single act unless explicitly excluded.

What is claimed is:

1. A method for forming a semiconductor device, the method comprising:
    providing a transistor structure comprising a gate trench extending into a semiconductor substrate from a first main surface of the semiconductor substrate, and an oxide layer formed on the first main surface and along sidewalls and a bottom of the gate trench, wherein a first portion of the oxide layer forms a gate oxide of the transistor structure; and
    replacing or modifying a second portion of the oxide layer on the first main surface of the semiconductor substrate in a region adjacent the gate trench, to obtain a contamination barrier layer structure on the region of the first main surface adjacent the gate trench and which comprises phosphorus, wherein the contamination barrier layer structure is located at a distance of less than 10 µm from the first portion of the oxide layer.

2. The method of claim 1, wherein modifying the second portion of the oxide layer comprises incorporating phosphorus dopants into the second portion of the oxide layer to obtain the contamination barrier layer structure.

3. The method of claim 2, wherein the phosphorus dopants are incorporated into the second portion of the oxide layer by plasma deposition or ion implantation.

4. The method of claim 2, wherein the phosphorus dopants are incorporated into the second portion of the oxide layer at a dose between $1*10^{16}$ dopants per $cm^2$ and $5*10^{17}$ dopants per $cm^2$.

5. The method of claim 1, wherein replacing the second portion of the oxide layer comprises removing the second portion of the oxide layer and replacing the second portion of the oxide layer with the contamination barrier layer structure.

6. The method of claim 5, wherein at least one contamination barrier layer of the contamination barrier layer structure is a phosphosilicate glass layer.

7. The method of claim 5, wherein the contamination barrier layer structure comprises at least two different contamination barrier layers selected from the group consisting of: a phosphosilicate glass layer; a borophosphosilicate glass layer; and a silicate glass layer.

8. The method of claim 1, wherein the second portion of the oxide layer is replaced or modified to obtain the contamination barrier layer structure such that at least part of the contamination barrier layer structure is located between at least a lateral end of the gate oxide and one or more inter-metal layers.

9. The method of claim 1, further comprising forming a gate electrode of the transistor structure before replacing or modifying the second portion of the oxide layer.

10. The method of claim 1, further comprising:
forming a mask layer on the semiconductor substrate,
wherein the second portion of the oxide layer is replaced or modified at regions of the semiconductor substrate uncovered by the mask layer.

11. The method of claim 1, wherein the second portion of the oxide layer to be replaced or modified is located on at least part of a source region of the transistor structure or on at least part of a shielding doping region of the transistor structure.

12. The method of claim 1, wherein at least part of the oxide layer remains on at least part of a source region of the transistor structure or on at least part of a shielding doping region of the transistor structure after replacing or modifying the second portion of the oxide layer.

13. The method of claim 1, further comprising:
forming a source electrode in contact with a source region of the semiconductor substrate at a source contact area,
wherein at least part of the contamination barrier layer structure is located between the gate oxide of the transistor structure and the source contact area.

14. A semiconductor device, comprising:
a transistor structure comprising a gate trench extending into a semiconductor substrate from a first main surface of the semiconductor substrate, and an oxide layer formed on the first main surface and along sidewalls and a bottom of the gate trench, wherein a portion of the oxide layer forms a gate oxide of the transistor structure, and
a contamination barrier layer structure located directly at the first main surface of the semiconductor substrate and at a distance of less than 10 μm from the gate oxide of the transistor structure,
wherein the contamination barrier layer structure has a phosphorus content of greater than 1%.

15. The semiconductor device of claim 14, wherein the contamination barrier layer structure extends along the first main surface of the semiconductor substrate starting at a lateral end of the gate oxide.

16. The semiconductor device of claim 14, wherein the contamination barrier layer structure is located between at least a lateral end of the gate oxide and one or more inter-metal layers.

17. The semiconductor device of claim 14, wherein the contamination barrier layer structure is located between a gate electrode of the transistor structure and a source contact area.

18. The semiconductor device of claim 14, wherein at least part of a gate electrode of the transistor structure is located in the gate trench extending into the semiconductor substrate.

19. The semiconductor device of claim 14, wherein at least one contamination barrier layer of the contamination barrier layer structure is a phosphosilicate glass layer.

20. The semiconductor device of claim 14, wherein the contamination barrier layer structure comprises at least two different contamination barrier layers selected from the group consisting of: a phosphosilicate glass layer; a borophosphosilicate glass layer; and a silicate glass layer.

21. The semiconductor device of claim 14, wherein the transistor structure has a breakdown voltage of at least 20 V.

22. The semiconductor device of claim 14, further comprising a source electrode in contact with a source region of the semiconductor substrate at a source contact area, wherein at least part of the contamination barrier layer structure is located between the gate oxide of the transistor structure and the source contact area.

23. A semiconductor device, comprising:
a vertical transistor structure comprising a semiconductor substrate with a first main surface, a source region, a body region, a drift region, and an oxide layer formed on the first main surface, wherein the body region separates the source region from the drift region in a vertical direction that is perpendicular to the first main surface, and
a contamination barrier layer structure located directly at the first main surface of the semiconductor substrate and at a distance of less than 10 μm from the oxide layer,
wherein the contamination barrier layer structure has a phosphorus content of greater than 1%.

* * * * *